(12) United States Patent
Seo et al.

(10) Patent No.: US 11,981,597 B2
(45) Date of Patent: May 14, 2024

(54) WINDOW, METHOD OF MANUFACTURING THE WINDOW, AND DISPLAY MODULE INCLUDING THE WINDOW

(71) Applicant: SAMSUNG DISPLAY CO., LTD., Yongin-si (KR)

(72) Inventors: Hyunseung Seo, Gwacheon-si (KR); Jonghwan Cho, Ansan-si (KR); Yongkyu Kang, Hwaseong-si (KR); Jihyun Ko, Bucheon-si (KR); Ho Yun Byun, Osan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 132 days.

(21) Appl. No.: 16/790,236

(22) Filed: Feb. 13, 2020

(65) Prior Publication Data

US 2020/0331799 A1 Oct. 22, 2020

(30) Foreign Application Priority Data

Apr. 22, 2019 (KR) .......................... 10-2019-0046560

(51) Int. Cl.
 *C03C 17/34* (2006.01)
 *H05K 5/00* (2006.01)
 *H05K 5/03* (2006.01)

(52) U.S. Cl.
 CPC ....... *C03C 17/3405* (2013.01); *H05K 5/0017* (2013.01); *H05K 5/03* (2013.01); *C03C 2218/32* (2013.01)

(58) Field of Classification Search
 CPC ............ C03C 17/3405; C03C 2218/32; C03C 2217/75; C03C 2217/76; H05K 5/0017; H05K 5/03; B32B 7/12; B32B 17/06; B32B 2457/20; B32B 27/281; B32B 27/308; B32B 27/38; H04M 1/0266; H04M 1/0269; H01L 27/156; H01L 27/3244; G02F 1/133308; G02F 1/1303; G02F 1/133331; G02B 5/30
 See application file for complete search history.

(56) References Cited

U.S. PATENT DOCUMENTS

| 8,704,441 B2 | 4/2014 | Fujita et al. |
| 8,797,234 B2 | 8/2014 | Watanabe et al. |
| 8,836,880 B2 | 9/2014 | Takama et al. |

(Continued)

FOREIGN PATENT DOCUMENTS

| CN | 101678390 A | * | 3/2010 | ............... B05D 1/30 |
| CN | 207586584 U | | 7/2016 | |

(Continued)

*Primary Examiner* — Nathan L Van Sell
(74) *Attorney, Agent, or Firm* — F. CHAU & ASSOCIATES, LLC

(57) ABSTRACT

A display module includes a display panel and a window. The window includes a base substrate and a plurality of functional layers. A central portion of the base substrate is flat, and an edge portion of the base substrate has a rounded shape. An upper portion of the edge portion of the window has the rounded shape and thus protrudes from a lower portion of the edge portion toward the outside. A first functional layer of the plurality of functional layers includes an acrylic-based material and/or an epoxy-based material, and a second functional layer of the plurality of functional layers includes a fluorine-based material.

18 Claims, 11 Drawing Sheets

(56) References Cited

U.S. PATENT DOCUMENTS

| | | |
|---|---|---|
| 8,953,123 B2 | 2/2015 | Harayama et al. |
| 9,442,316 B2 * | 9/2016 | Watanabe .......... G02F 1/133308 |
| 10,592,025 B2 | 3/2020 | Noguchi et al. |
| 10,684,655 B2 | 6/2020 | Park et al. |
| 10,802,179 B2 | 10/2020 | Bellman et al. |
| 2007/0242177 A1 | 10/2007 | Lee et al. |
| 2008/0280060 A1 | 11/2008 | Baeudoin et al. |
| 2011/0102302 A1 | 5/2011 | Watanabe et al. |
| 2011/0310488 A1 | 12/2011 | Tomotoshi et al. |
| 2012/0127091 A1 | 5/2012 | Kim et al. |
| 2013/0300974 A1 | 11/2013 | Yoshimoto |
| 2014/0377508 A1 | 12/2014 | Oh et al. |
| 2015/0002758 A1 * | 1/2015 | Chu ..................... G06F 3/041 349/12 |
| 2015/0138484 A1 * | 5/2015 | Watanabe ......... G02F 1/133526 349/58 |
| 2017/0276977 A1 | 9/2017 | Li et al. |
| 2017/0324060 A1 | 11/2017 | Kim et al. |
| 2018/0011225 A1 * | 1/2018 | Bellman ............... C03C 21/002 |
| 2018/0364760 A1 | 12/2018 | Ahn et al. |
| 2019/0138127 A1 | 5/2019 | Seo et al. |
| 2019/0375195 A1 | 12/2019 | Choi et al. |

FOREIGN PATENT DOCUMENTS

| | | |
|---|---|---|
| CN | 207689793 U | 8/2018 |
| CN | 207742867 U | 8/2018 |
| CN | 207851465 U | 9/2018 |
| JP | 2007288184 | 11/2007 |
| JP | 2012163763 | 8/2012 |
| JP | 2013020181 | 1/2013 |
| JP | 5237396 | 4/2013 |
| JP | 2013235146 | 11/2013 |
| JP | 5913697 | 4/2016 |
| JP | 2018036514 | 3/2018 |
| JP | 2012215886 | 11/2022 |
| KR | 10-2010-0024397 | 3/2010 |
| KR | 10-2012-0054275 | 5/2012 |
| KR | 20140121722 | 10/2014 |
| KR | 20170045318 | 4/2017 |
| KR | 10-2017-0126067 | 11/2017 |
| KR | 20180009586 | 1/2018 |
| KR | 20180073420 | 7/2018 |
| KR | 20180098890 | 9/2018 |
| KR | 10-2019-0026005 | 3/2019 |
| KR | 10-2019-0052730 | 5/2019 |
| WO | WO2012002260 | 5/2012 |

\* cited by examiner

WINDOW, METHOD OF MANUFACTURING THE WINDOW, AND DISPLAY MODULE INCLUDING THE WINDOW

CROSS-REFERENCE TO RELATED APPLICATION

This U.S. non-provisional patent application claims priority under 35 U.S.C. § 119 to Korean Patent Application No. 10-2019-0046560, filed on Apr. 22, 2019, the entire contents of which are hereby incorporated by reference.

TECHNICAL FIELD

The present disclosure relates to a display and, more specifically, to a window, a method of manufacturing the window, and a display module including the window.

DISCUSSION OF THE RELATED ART

Display devices are widely used in multimedia devices such as televisions, smartphones and other portable phones, navigation systems, computer monitors, and game consoles. While there are many different types of display devices, a display device may include a display panel for displaying an image to a user, and a window for protecting the display panel.

The window may include a base substrate including glass or a synthetic resin, and one or more functional layers disposed on a top surface of the base substrate. The top surface of the base substrate is the surface of the base substrate that is opposite to the surface that faces the display panel. The functional layers may provide various properties such as to protect the base substrate from an external impact and to repel fingerprints.

A side surface of the window may have a curved shape. In this case, the functional layers of the window may be easily peeled off.

SUMMARY

In an embodiment of the inventive concepts, a display module includes a display panel and a window. The display panel includes a display area parallel to a plane defined by a first direction and a second direction intersecting the first direction, and a non-display area surrounding the display area. The window is disposed on the display panel and includes a transparent material.

The window includes a first portion, a second portion, a third portion, and a fourth portion. The first portion included a first area at least partially overlapping with the display area, and a second area at least partially overlapping with the non-display area. The second portion extends from the first area of the first portion in a third direction perpendicular to the first direction and the second direction. The third portion extends from the second area of the first portion in the third direction, extends from the second portion in the first direction or the second direction, and includes an outer surface including a first curved surface. The fourth portion extends from the third portion in the first direction or the second direction, does not overlap with the first portion in the third direction, and includes an outer surface including a second curved surface.

In an embodiment, a first thickness of the first portion and a second thickness of the second portion may be constant, and a third thickness of the third portion and a fourth thickness of the fourth portion may gradually decrease in the first direction or the second direction.

In an embodiment, the window may further include a first functional layer and a second functional layer. The first functional layer may be disposed on the second portion, the third portion and the fourth portion and may include a first material. The second functional layer may be disposed on the first functional layer and may include a second material different from the first material.

In an embodiment, the first material may include an acrylic-based material and/or an epoxy-based material, and the second material may include a fluorine-based material.

In an embodiment, a thickness of the first functional layer may range from about 40 µm to about 50 µm, and a thickness of the second functional layer may range from about 4 µm to about 6 µm.

In an embodiment, the first functional layer may include a first sub-functional layer that is in contact with the second portion, the third portion and the fourth portion, and a second sub-functional layer disposed between the first sub-functional layer and the second functional layer.

In an embodiment, a thickness of the first sub-functional layer may gradually increase in one direction, and a thickness of the second sub-functional layer may gradually decrease in the one direction.

In an embodiment, a portion, adjacent to a first side, of the first sub-functional layer may have a first thickness, and a portion, adjacent to a second side, of the first sub-functional layer may have a second thickness. The second thickness may range from about 125% to about 135% of the first thickness.

In an embodiment, each of thicknesses of the first and second sub-functional layers may range from about 20 µm to about 25 µm in a central portion of the display area.

In an embodiment, the display module may further include an ink layer disposed between the display panel and the window and at least partially overlapping with the non-display area.

In an embodiment, the ink layer might not overlap with the fourth portion of the window in the third direction.

In an embodiment, the display module may further include a polarizing layer disposed between the display panel and the ink layer.

In an embodiment, the display module may further include an auxiliary panel disposed under the display panel and including a synthetic resin or a metal.

In an embodiment, the display module may further include a set portion receiving the auxiliary panel, the display panel, the polarizing layer, and the window. The set portion may include a support portion disposed under the auxiliary panel, and a fixing portion which extends from a side of the support portion in the third direction and is in contact with the first portion and the fourth portion of the window and the first functional layer.

In an embodiment, the fixing portion may include an outer surface having a shape corresponding to a portion of the second curved surface.

BRIEF DESCRIPTION OF THE DRAWINGS

The accompanying drawings are included to provide a further understanding of the inventive concepts, and are incorporated in and constitute a part of this specification. The drawings illustrate exemplary embodiments of the inventive concepts and, together with the description, serve to explain principles of the inventive concepts. In the drawings.

DETAILED DESCRIPTION OF THE EMBODIMENTS

Figure 1:
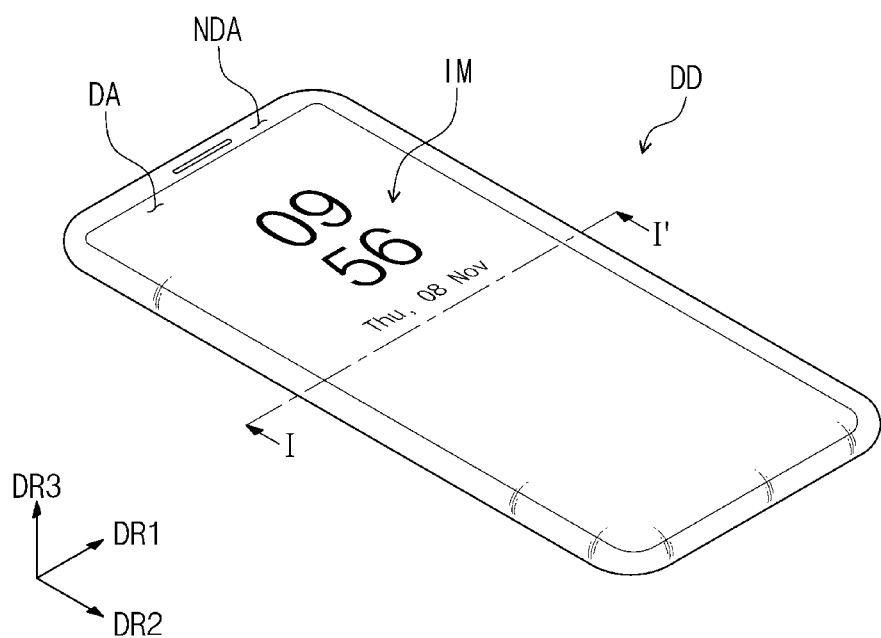
FIG. 1 is a perspective view illustrating a display device according to an embodiment of the inventive concepts.

The inventive concepts now will be described more fully hereinafter with reference to the accompanying drawings, in which various embodiments are shown. The inventive concepts may, however, be embodied in many different forms, and should not be construed as limited exclusively to the embodiments set forth herein. Rather, these embodiments are provided so that this disclosure will be thorough and complete, and will fully convey the scopes of the inventive concepts to those skilled in the art. Like reference numerals may refer to like elements throughout the specification and the drawings.

It will be understood that when an element such as a layer, region or substrate is referred to as being "on" another element, it can be directly on the other element or intervening elements may be present. As used herein, the singular forms "a," "an," and "the" are intended to include the plural forms, including "at least one," unless the content clearly indicates otherwise. It will be further understood that the terms "comprises" and/or "comprising," or "includes" and/or "including" when used in this specification or claims, specify the presence of stated features, regions, integers, steps, operations, elements, and/or components, but do not preclude the presence or addition of one or more other features, regions, integers, steps, operations, elements, components, and/or groups thereof.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings herein. "About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" or "approximately" may be taken to mean plus or minus 5%, 2% or 1% from the stated value.

Exemplary embodiments are described herein with reference to cross-sectional illustrations and/or plane illustrations that are idealized exemplary illustrations. In the drawings, the thicknesses of layers and regions may be exaggerated for clarity. Accordingly, variations from the shapes of the illustrations as a result, for example, of manufacturing techniques and/or tolerances, may be possible. However, the figures themselves may be intended to illustrate at least one exemplary embodiment of the present inventive concept and so the angles shown, the relative sizes, and the shapes of the elements shown may be seen as exemplary limitations.

FIG. 1 is a perspective view illustrating a display device DD according to an embodiment of the inventive concepts.

A smart phone is illustrated as an example of the display device DD in FIG. 1. However, embodiments of the inventive concepts are not limited exclusively thereto. In certain embodiments, the display device DD may be applied to large-sized electronic devices (e.g., televisions and monitors) and small and middle-sized electronic devices (e.g., tablets, car navigation units, game consoles, and smart watches).

A display area DA and a non-display area NDA may be defined in the display device DD.

The display area DA, in which an image IM is displayed, may be parallel to a plane defined by a first directional axis DR1 and a second directional axis DR2.

A normal direction of the display area DA (i.e., a thickness direction of the display device DD) may be indicated by a third directional axis DR3. A front surface (or a top surface) and a rear surface (or a bottom surface) of each of components or members may be defined by the third directional axis DR3. However, directions indicated by the first to third directional axes DR1, DR2 and DR3 may be relative concepts and may be changed into other directions. Hereinafter, first to third directions are the directions indicated by the first to third directional axes DR1, DR2 and DR3, respectively, and are indicated by the same reference designators as the first to third directional axes DR1, DR2 and DR3, respectively.

A shape of the display area DA in FIG. 1 is illustrated as an example. In certain embodiments, the shape of the display area DA may be variously changed from what is shown.

The non-display area NDA may be adjacent to the display area DA on at least one side thereof and may be an area in which the image IM is not displayed. The non-display area NDA may at least partially surround the display area DA. A bezel area of the display device DD may be defined by the non-display area NDA.

The non-display area NDA may surround the display area DA from one or more sides when viewed in a plan view. However, embodiments of the inventive concepts are not limited thereto. The shapes of the display area DA and the non-display area NDA may be variously designed.

At least a portion of the non-display area NDA may have a curved shape. For example, corners of the otherwise rectangular display area may be curved and/or one or more sides of the display area DA may be curved down towards the bottom surface of the display device DD. This will be described in detail with reference to FIGS. 2A and 2B.

Figure 2A:
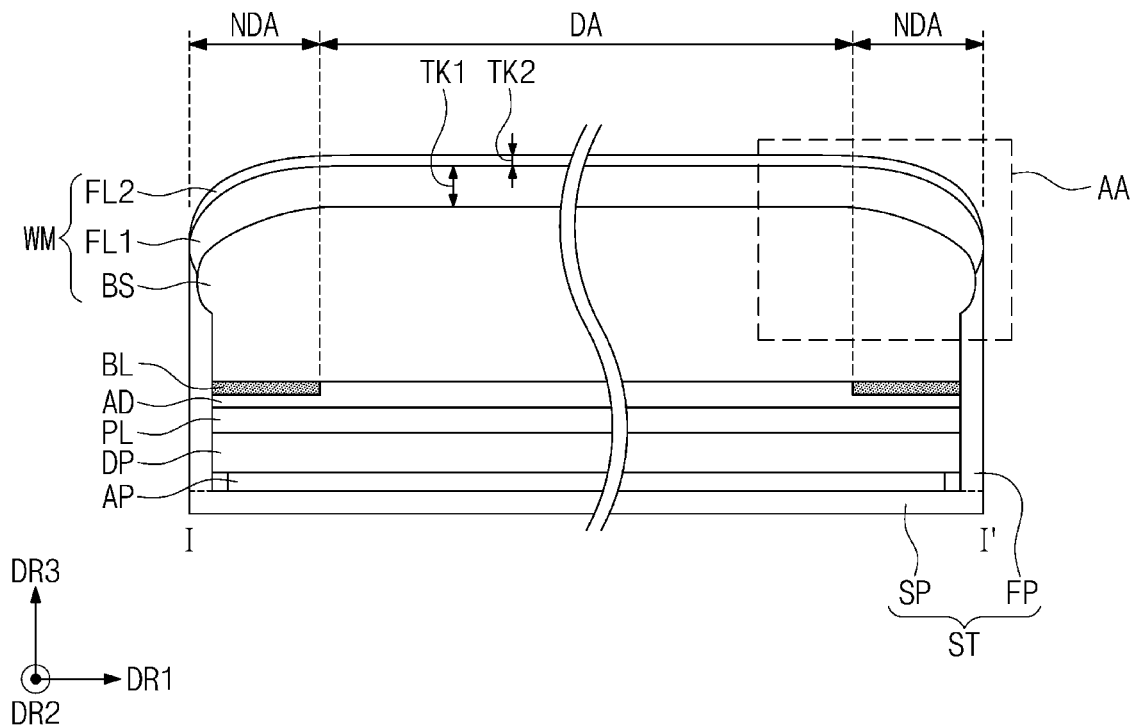
FIG. 2A is a cross-sectional view taken along a line I-I' of FIG. 1 illustrating a portion of a display device according to an embodiment of the inventive concepts.
Figure 2B:
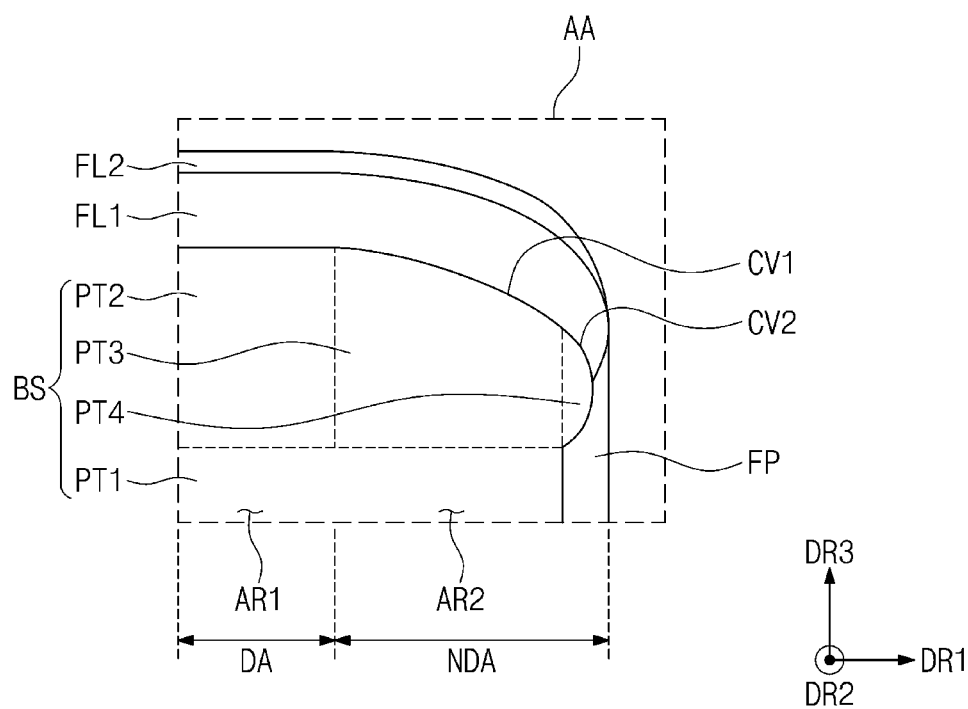
FIG. 2B is an enlarged view of a portion 'AA' of FIG. 2A.

FIG. 2A is a cross-sectional view taken along a line I-I' of FIG. 1 illustrating a portion of a display device DD according to an embodiment of the inventive concepts. FIG. 2B is an enlarged view of a portion 'AA' of FIG. 2A.

FIG. 2A illustrates a cross-sectional view of the display device DD, which is taken in the first direction DR1. However, a cross-sectional view of the display device DD which is taken in the second direction DR2 may have substantially the same shape as illustrated in FIG. 2A.

The display device DD may include an auxiliary panel AP, a display panel DP, a polarizing layer PL, an adhesive layer AD, an ink layer BL, a window WM, and a set portion ST.

The auxiliary panel AP may be disposed under the display panel DP. The auxiliary panel AP may protect the display panel DP from an impact applied from there below and may assist in the release of heat generated in the display panel DP to the outside.

The auxiliary panel AP may include a synthetic resin or a metal material. The metal material may be, but is not limited to being, aluminum (Al).

The display panel DP may be a component for generating the image IM displayed in the display area DA and may be disposed on the auxiliary panel AP. The display panel DP may include a plurality of transistors and a plurality of light emitting elements. Each of the light emitting elements may be an organic light emitting element (OLED) or a micro LED.

The polarizing layer PL may be disposed on the display panel DP. The polarizing layer PL may polarize at least a portion of light incident from the outside of the display device DD to prevent reflected light from being visible to a user's eyes.

The adhesive layer AD may be disposed between the polarizing layer PL and the window WM to couple the polarizing layer PL and the window WM to each other. In an embodiment, the adhesive layer AD may be, but is not limited to being, an optically clear adhesive (OCA). For example, the adhesive layer AD may include a material which has a transparent property and thus is capable of transmitting light generated from the display panel DP.

The ink layer BL may be disposed on a bottom surface of the window WM. The ink layer BL may have a predetermined color. The predetermined color may be, but is not limited to, a black color.

The non-display area NDA of the display device DD may be defined by the ink layer BL.

The window WM may include a transparent material and may transmit light generated in the display panel DP.

The window WM may include a base substrate BS, a first functional layer FL1, and a second functional layer FL2.

The base substrate BS may include a synthetic resin. For example, the base substrate BS may include polyvinylidene chloride (PVDC), polyethylene terephthalate (PET), nylon, polypropylene (PP), and/or polyethylene (PE). However, embodiments of the inventive concepts are not limited thereto. According to an embodiment, the base substrate BS may include glass.

Referring to FIG. 2B, the base substrate BS may include a first portion PT1, a second portion PT2, a third portion PT3, and a fourth portion PT4. A thickness of each of the first, second, third and fourth portions PT1, PT2, PT3 and PT4 may be defined as a length measured in the third direction DR3.

The first portion PT1 may correspond to a lowest portion of the base substrate BS, and the second to fourth portions PT2 to PT4 may correspond to an upper portion of the base substrate BS. The second to forth portions PT2 to PT4 may each be disposed over the first portion PT1.

The first portion PT1 may include a first area AR1 overlapping with the display area DA, and a second area AR2 overlapping with the non-display area NDA.

The thickness in the third direction DR3 of the first portion PT1 may have a constant value over the first direction DR1, which is the longitudinal direction of the first portion PT1.

The second portion PT2 may extend from the first area AR1 of the first portion PT1 in the third direction DR3. The second portion PT2 may overlap with the display area DA.

The thickness of the second portion PT2 may have a constant value across its length.

The third portion PT3 may extend from the first portion PT1 in the third direction DR3 and may extend from the second portion PT2 in the first direction DR1 or the second direction DR2. An outer surface of the third portion PT3 may include a first curved surface CV1 having curvature.

A thickness of at least a portion of the third portion PT3 may gradually decrease in the first direction DR1 or the second direction DR2.

The third portion PT3 may overlap with the non-display area NDA.

The fourth portion PT4 may extend from the third portion PT3 in the first direction DR1 or the second direction DR2. An outer surface of the fourth portion PT4 may include a second curved surface CV2 having curvature.

The second curved surface CV2 of the fourth portion PT4 and the first curved surface CV1 of the third portion PT3 may meet with each other to form one continuous curved surface.

A thickness of at least a portion of the fourth portion PT4 may gradually decrease in the first direction DR1 or the second direction DR2.

The fourth portion PT4 may overlap with the non-display area NDA.

As described above, due to the fourth portion PT4, the upper portion of the base substrate BS may protrude from the lower portion of the base substrate BS toward the outside. In addition, an edge portion of an outer surface of the upper portion of the base substrate BS may have a rounded shape by the curved surfaces CV1 and CV2.

The first functional layer FL1 may be disposed on the base substrate BS. In an embodiment, the first functional layer FL may be in contact with an upper portion of the second curved surface CV2 of the fourth portion PT4 but might not be in contact with a lower surface of the second curved surface CV2.

The first functional layer FL1 may have a high hardness (e.g. a Mohs scale hardness greater than or equal to 3) and thus may protect the base substrate BS from an impact applied from the outside.

The first functional layer FL1 may include an acrylic-based material and/or an epoxy-based material. In an embodiment, the first functional layer FL1 may include a hybrid material in which the acrylic-based material and the epoxy-based material are mixed with each other. However, the material of the first functional layer FL1 is not limited thereto. In an embodiment, the first functional layer FL1 may include polyimide.

A thickness TK1 (hereinafter, referred to as a first thickness) of the first functional layer FL1 in the display area DA may range from about 40 μm to about 50 μm. If the first thickness TK1 is less than 40 μm, the first functional layer FL1 might not effectively absorb an impact applied to the base substrate BS. If the first thickness TK1 is greater than 50 µm, a defect may occur in a manufacturing process by the curved surfaces CV1 and CV2 of an edge portion of the base substrate BS.

The second functional layer FL2 may be disposed on the first functional layer FL.

The second functional layer FL2 may provide an outermost surface of the display device DD and may include a hydrophobic material.

If the second functional layer FL2 does not exist, a stain may be generated at a surface of the display device DD by a user's fingerprint since the first functional layer FL1 includes a hydrophilic material. However, according to the embodiment of the inventive concepts, the second functional layer FL2 including the hydrophobic and/or oleophobic material may be disposed at the outermost portion of the display device DD, and thus it is possible to prevent a stain by a user's fingerprint from being generated at the surface of the display device DD.

In addition, the second functional layer FL2 may reduce a friction coefficient of the surface of the display device DD to provide a desired touch feeling.

For example, the hydrophobic material may include, but is not limited to including, a fluorine-based compound.

A thickness TK2 (hereinafter, referred to as a second thickness) of the second functional layer FL2 in the display area DA may range from about 4 µm to about 6 µm.

The set portion ST may receive the auxiliary panel AP, the display panel DP, the polarizing layer PL, the adhesive layer AD, the ink layer BL, and the window WM.

The set portion ST may include a synthetic resin or a metal material.

The set portion ST may include a support portion SP and a fixing portion FP.

The support portion SP may be disposed under the auxiliary panel AP and may support the components disposed thereon.

The fixing portion FP may extend from the support portion SP in the third direction DR3.

The fixing portion FP may fix at least a portion of at least one of the auxiliary panel AP, the display panel DP, the polarizing layer PL, the adhesive layer AD, the ink layer BL, and the window WM.

The fixing portion FP may be in contact with at least one of the first portion PT1, the fourth portion PT4 and the first functional layer FL1 of the window WM.

Referring to FIG. 2B, a portion (i.e., an outer surface) of the fixing portion FP, which is in contact with the base substrate BS, may have a curved shape corresponding to a portion of the second curved surface CV2 of the fourth portion PT4. For example, at least a portion of the outer surface of the fixing portion FP may have a shape corresponding to a lower portion of the second curved surface CV2.

Figure 3:
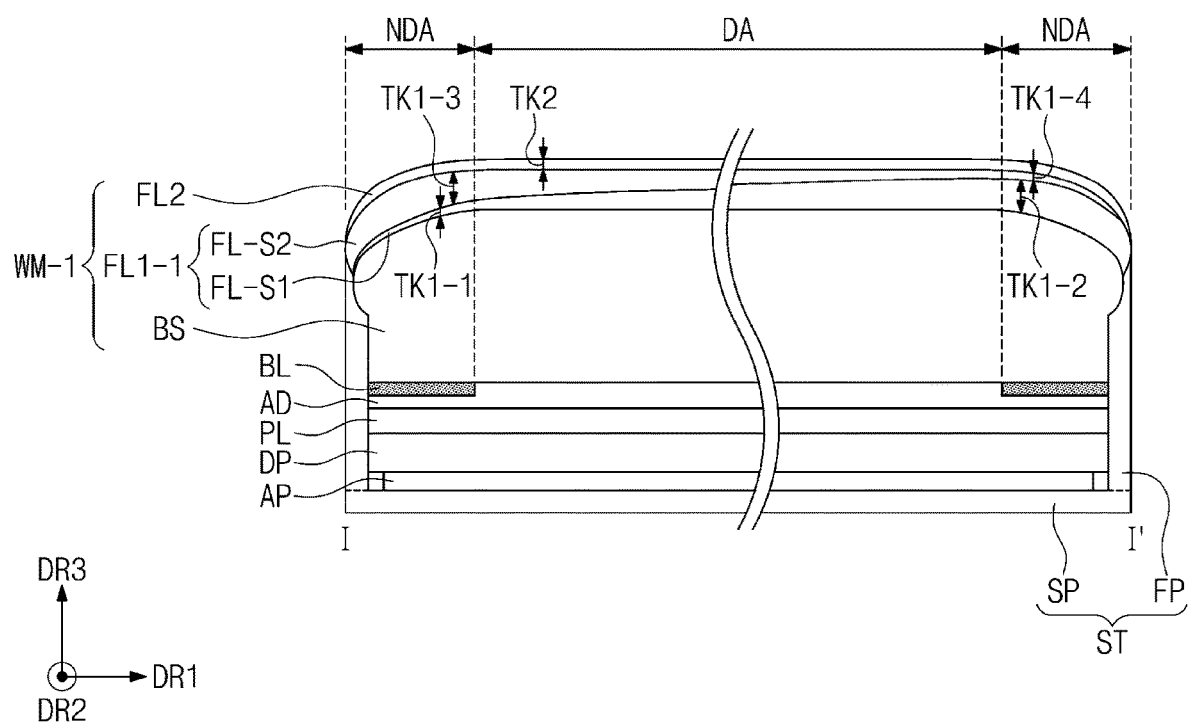
FIG. 3 is a cross-sectional view taken along the line I-I' of FIG. 1 illustrating a portion of a display device according to an embodiment of the inventive concepts.

FIG. 3 is a cross-sectional view taken along the line I-I' of FIG. 1 to illustrate a portion of a display device DD according to an embodiment of the inventive concepts. For example, FIG. 3 illustrates a modified embodiment of the embodiment illustrated in FIG. 2A.

Referring to FIG. 3, a window WM-1 may include a base substrate BS, a first functional layer FL-1, and a second functional layer FL2. The base substrate BS and the second functional layer FL2 may be substantially the same as described with reference to FIG. 2A, and thus the descriptions thereto will be omitted.

The first functional layer FL1-1 may include a first sub-functional layer FL-S1 and a second sub-functional layer FL-S2. Each of the first and second sub-functional layers FL-S1 and FL-S2 may include an acrylic-based material and/or an epoxy-based material.

Referring to FIGS. 2B and 3, the first sub-functional layer FL-S1 may be disposed on the base substrate BS and may be in contact with a top surface of the second portion PT2 of the base substrate BS, the first curved surface CV1 of the third portion PT3 of the base substrate BS, and the second curved surface CV2 of the fourth portion PT4 of the base substrate BS. In an embodiment, the first sub-functional layer FL-S1 may be in contact with an upper surface of the second curved surface CV2 of the fourth portion PT4 but might not be in contact with a lower surface of the second curved surface CV2.

The first sub-functional layer FL-S1 may have a first side and a second side which are opposite to each other. A thickness TK-1 (hereinafter, referred to as a first measurement thickness) measured at a portion, adjacent to the first side, of the first sub-functional layer FL-S1 may be less than a thickness TK1-2 (hereinafter, referred to as a second measurement thickness) measured at a portion, adjacent to the second side, of the first sub-functional layer FL-S1. The second measurement thickness TK1-2 may range from about 125% to about 135% of the first measurement thickness TK1-1.

In a central portion of the display area DA, a thickness of the first sub-functional layer FL-S1 may range from about 20 µm to about 25 µm.

The second sub-functional layer FL-S2 may be disposed between the first sub-functional layer FL-S1 and the second functional layer FL2.

A thickness TK1-3 (hereinafter, referred to as a third measurement thickness) measured at a portion, adjacent to the first side, of the second sub-functional layer FL-S2 may be greater than a thickness TK1-4 (hereinafter, referred to as a fourth measurement thickness) measured at a portion, adjacent to the second side, of the second sub-functional layer FL-S2. The third measurement thickness TK1-3 may range from about 125% to about 135% of the fourth measurement thickness TK1-4.

Other components may be substantially the same as corresponding components described with reference to FIGS. 2A and 2B, and thus the descriptions thereto are omitted.

Figure 4:
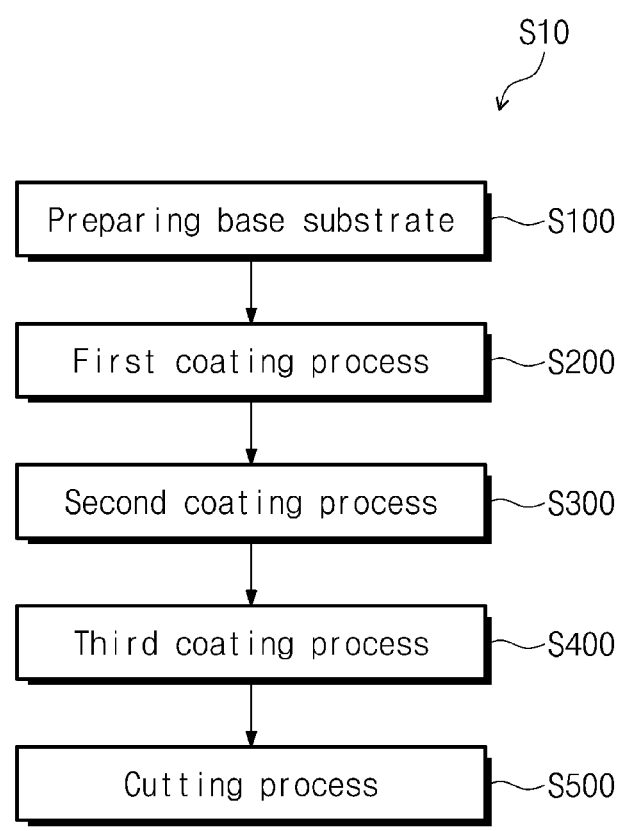
FIG. 4 is a flowchart illustrating a method of manufacturing a window, according to an embodiment of the inventive concepts.

FIG. 4 is a flowchart illustrating a method S10 of manufacturing a window, according to an embodiment of the inventive concepts. For example, FIG. 4 is a flowchart illustrating a method of manufacturing the window WM-1 illustrated in FIG. 3.

The method S10 of manufacturing a window may include preparing a base substrate (S100), performing a first coating process (S200), performing a second coating process (S300), performing a third coating process (S400), and performing a cutting process (S500).

Figure 5A:
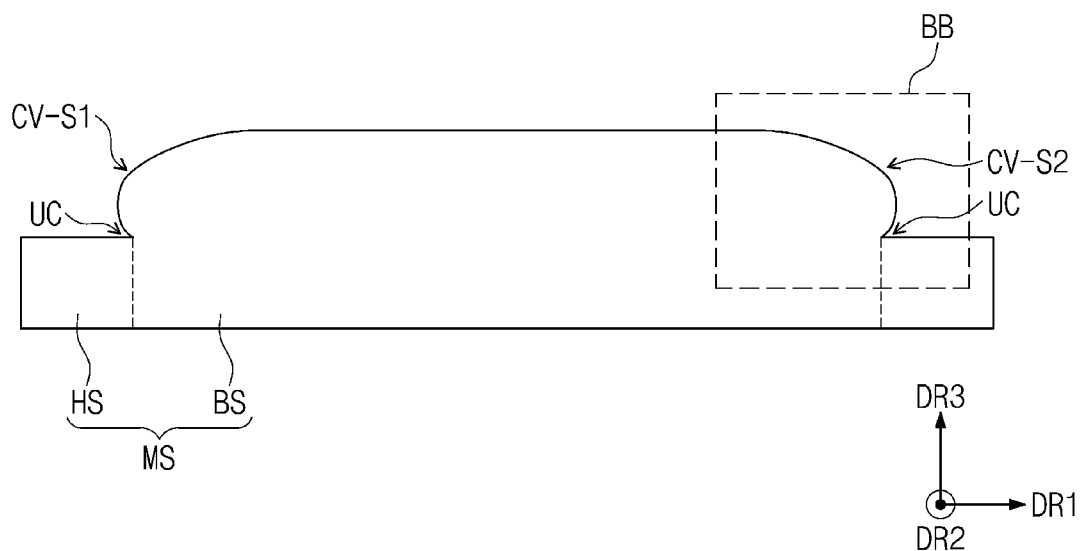
FIG. 5A is a cross-sectional view illustrating a process of preparing a base substrate in FIG. 4.
Figure 5B:
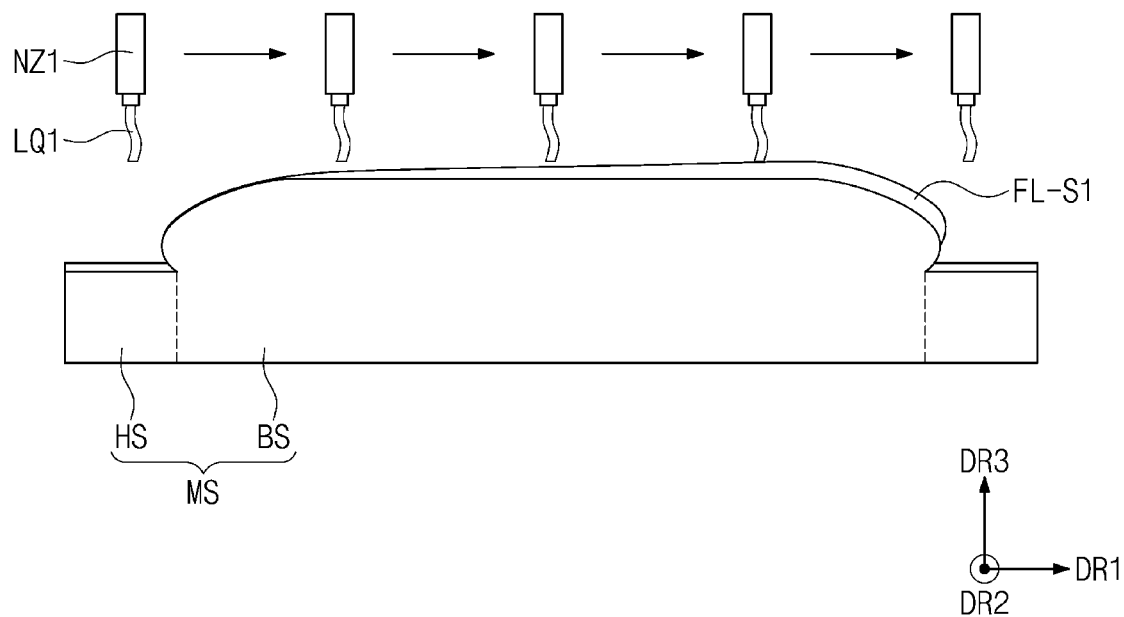
FIG. 5B is a cross-sectional view illustrating a first coating process of FIG. 4.
Figure 5C:
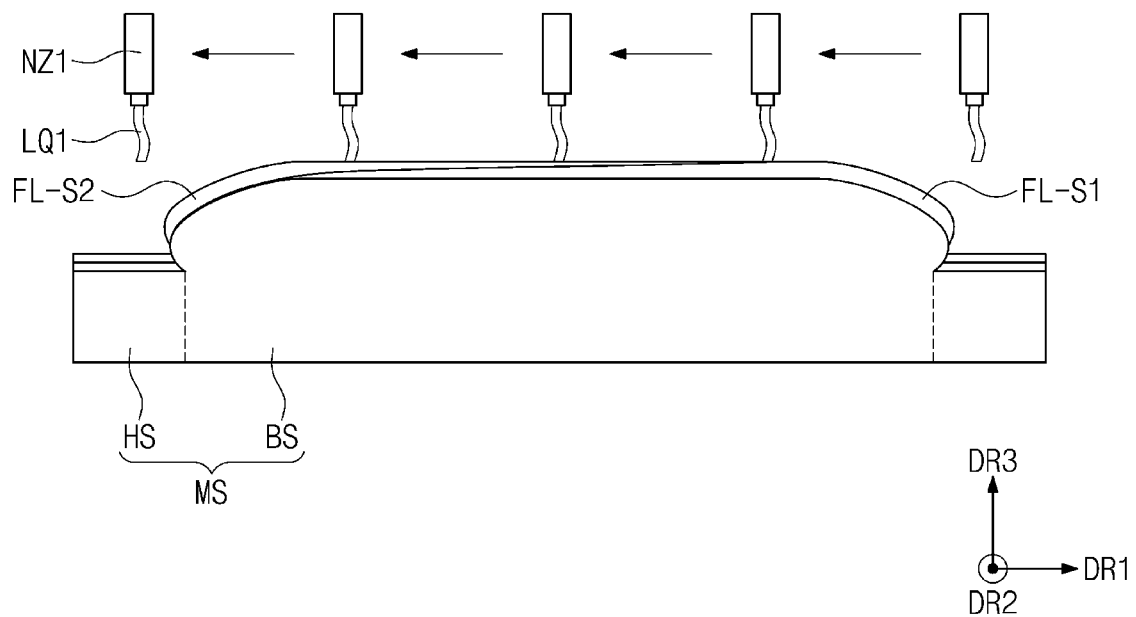
FIG. 5C is a cross-sectional view illustrating a second coating process of FIG. 4.
Figure 5D:
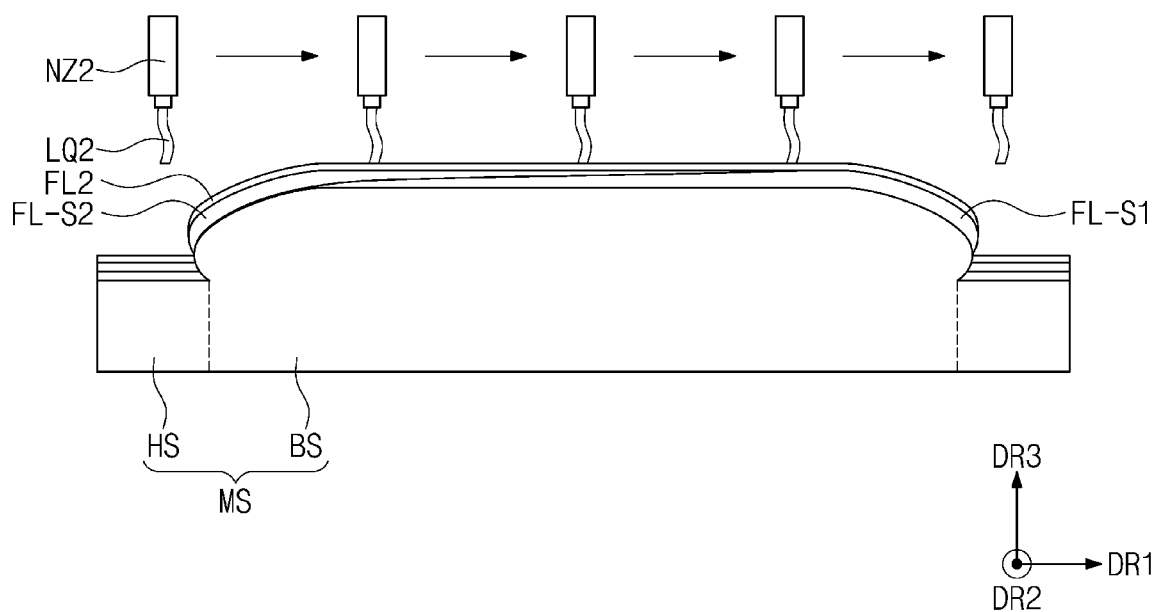
FIG. 5D is a cross-sectional view illustrating a third coating process of FIG. 4.
Figure 5E:
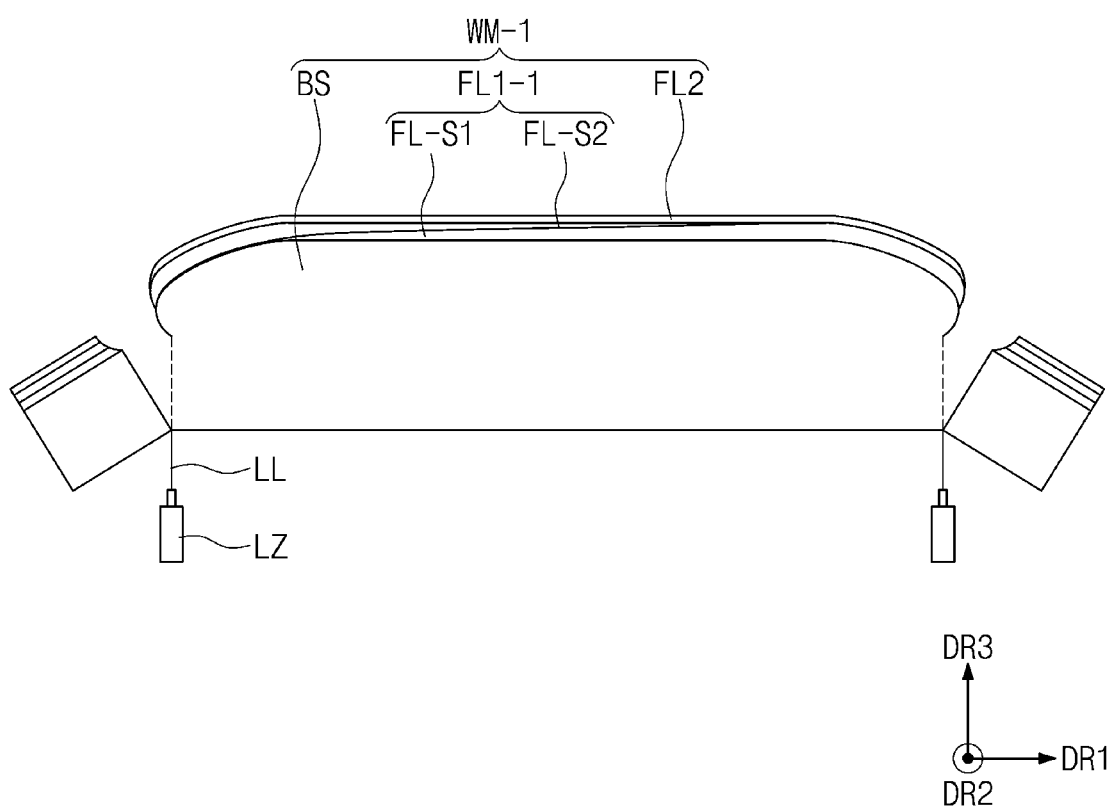
FIG. 5E is a cross-sectional view illustrating a cutting process of FIG. 4.

FIG. 5A illustrates the process S100 of preparing a base substrate in FIG. 4. FIG. 5B illustrates the first coating process S200 of FIG. 4. FIG. 5C illustrates the second coating process S300 of FIG. 4. FIG. 5D illustrates the third coating process S400 of FIG. 4. FIG. 5E illustrates the cutting process S500 of FIG. 4.

Referring to FIG. 5A, a master substrate MS including a base substrate BS and an auxiliary portion HS may be prepared in the process S100 of preparing the base substrate. The base substrate BS described above may be formed by removing the auxiliary portion HS from the master substrate MS.

Base-curved surfaces CV-S1 and CV-S2 may exist at edge portions of the base substrate BS of the master substrate MS, and thus recesses UC having undercut shapes may be formed between the auxiliary portion HS and an upper portion of the base substrate BS.

Referring to FIG. 5B, in the first coating process S200, a first solution LQ1 may be coated on the master substrate MS while moving a first nozzle NZ1 in one direction. Thus, a first sub-functional layer FL-S1 may be formed.

Even though the amount of the first solution LQ1 discharged from the first nozzle NZ1 per unit time is constant, due to the movement direction of the first nozzle NZ1 and the shapes of the base-curved surfaces CV-S1 and CV-S2, the first solution LQ1 may be more thinly coated on a first base-curved surface CV-S1 but the first solution LQ1 may be more thickly coated on a second base-curved surface CV-S2.

Referring to FIG. 5C, in the second coating process S300, the first solution LQ1 may be coated again on the first sub-functional layer FL-S1 while moving the first nozzle NZ1 in an opposite direction to the one direction. Thus, a second sub-functional layer FL-S2 may be formed.

Even though the amount of the first solution LQ1 discharged from the first nozzle NZ1 per unit time is constant, due to the movement direction of the first nozzle NZ1 and the shapes of the base-curved surfaces CV-S1 and CV-S2, the first solution LQ1 may be more thinly coated on the second base-curved surface CV-S2 but the first solution LQ1 may be more thickly coated on the first base-curved surface CV-S1.

The same material may be coated twice while changing the direction through the first and second coating processes S200 and S300 as described above, and thus the first functional layer FL1-1 (see FIG. 3) having a uniform thickness may be formed on the base substrate BS having the base-curved surfaces CV-S1 and CV-S2.

Referring to FIG. 5D, in the third coating process S400, a second solution LQ2 may be coated on the second sub-functional layer FL-S2 by using a second nozzle NZ2. Thus, a second functional layer FL2 may be formed.

A direction in which the second nozzle NZ2 moves might not matter in the third coating process S400. This may be because a process variation caused by the base-curved surfaces CV-S1 and CV-S2 is small since a thickness of the second functional layer FL2 is smaller than a thickness of the first functional layer FL1-1.

Referring to FIG. 5E, in the cutting process S500, the base substrate BS and the auxiliary portion HS may be separated from each other.

In FIG. 5E, the master substrate MS may be irradiated by laser light LL produced by a laser device LZ to perform the cutting process S500. However, embodiments of the inventive concepts are not limited thereto. In an embodiment, the cutting process S500 may be performed using a cutting blade.

FIGS. 6A, 6B, 6C, 7A, 7B and 7C are enlarged views illustrating modified embodiments BB-1 to BB-6 of a portion 'BB' of FIG. 5A.

Figure 6A:
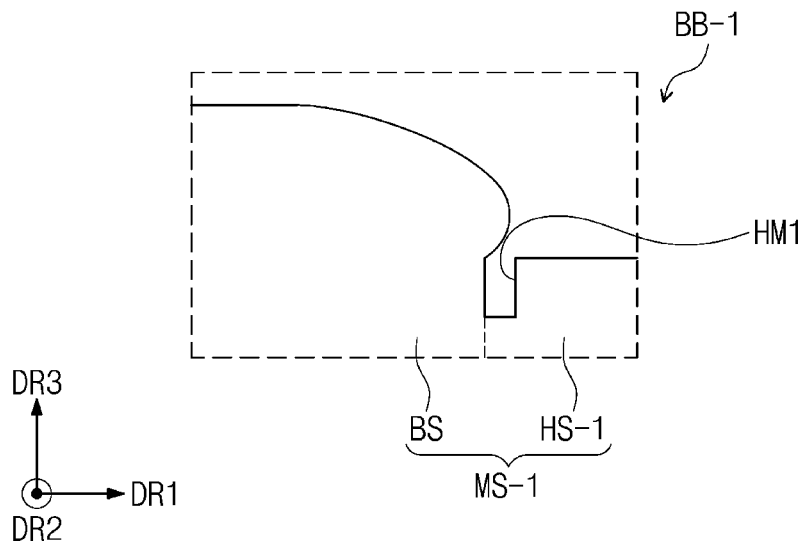
FIGS. 6A, 6B, 6C, 7A, 7B and 7C are enlarged views illustrating modified embodiments of a portion 'BB' of FIG. 5A.

Referring to FIG. 6A, a master substrate MS-1 may include a base substrate BS and an auxiliary portion HS-L.

A first recess HM1, recessed in a direction parallel to the third direction DR3, may be defined in the auxiliary portion HS-1.

Figure 6B:
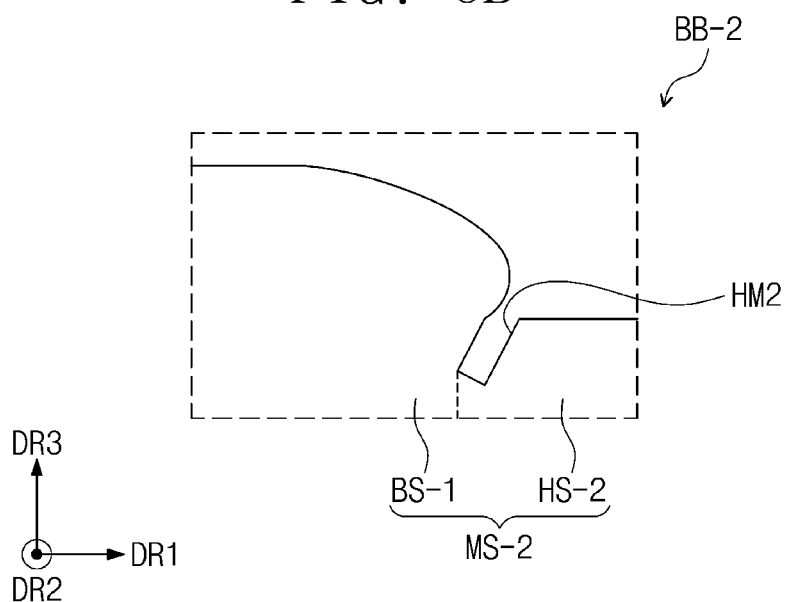

Referring to FIG. 6B, a master substrate MS-2 may include a base substrate BS-1 and an auxiliary portion HS-2.

A second recess HM2 recessed in an oblique direction toward the base substrate BS-1 may be defined in the auxiliary portion HS-2.

Due to the second recess HM2, the base substrate BS-1 may have a different shape from that of the base substrate BS described above. For example, a portion of a lower portion of the base substrate BS-1, which is adjacent to the second recess HM2, may have a shape of which a width is gradually changed in the third direction DR3.

Figure 6C:
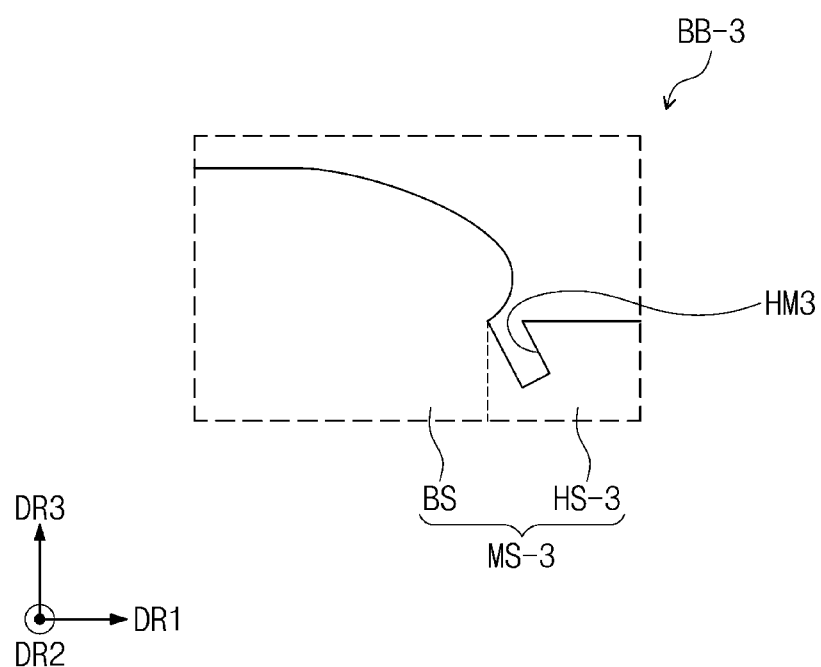

Referring to FIG. 6C, a master substrate MS-3 may include a base substrate BS and an auxiliary portion HS-3.

A third recess HM3 recessed in an oblique direction toward the outside may be defined in the auxiliary portion HS-3.

The first to third recesses HM1 to HM3 may prevent a portion of the solutions LQ1 and LQ2 from being coated on an undesired portion in the first to third coating processes S200, S300 and S400.

Figure 7A:
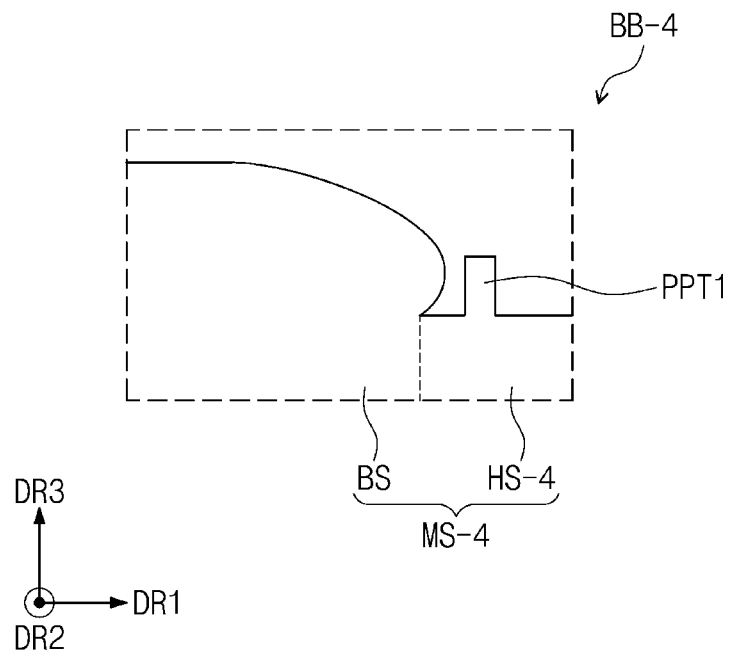

Referring to FIG. 7A, a master substrate MS-4 may include a base substrate BS and an auxiliary portion HS-4.

The auxiliary portion HS-4 may include a first protrusion PPT1 protruding in a direction parallel to the third direction DR3.

Figure 7B:
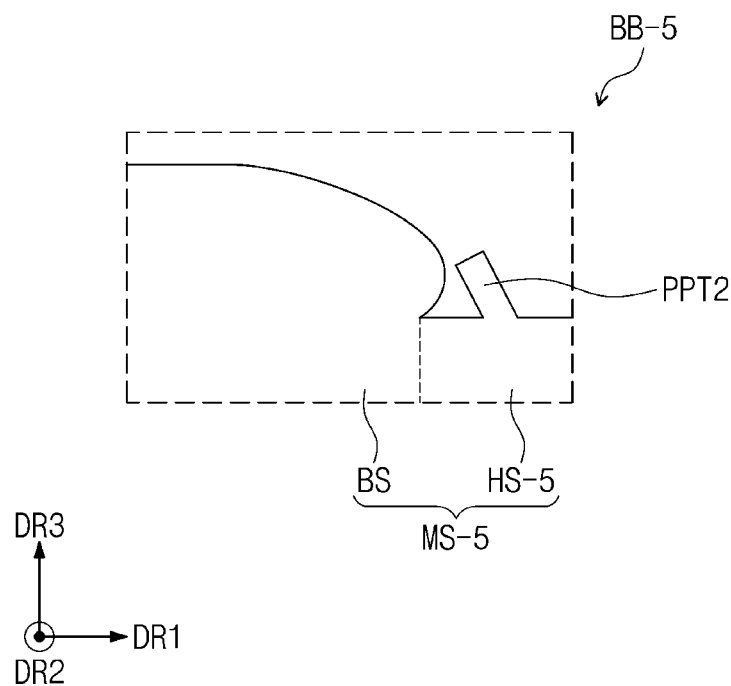

Referring to FIG. 7B, a master substrate MS-5 may include a base substrate BS and an auxiliary portion HS-5.

The auxiliary portion HS-5 may include a second protrusion PPT2 protruding in an oblique direction toward the base substrate BS.

Figure 7C:
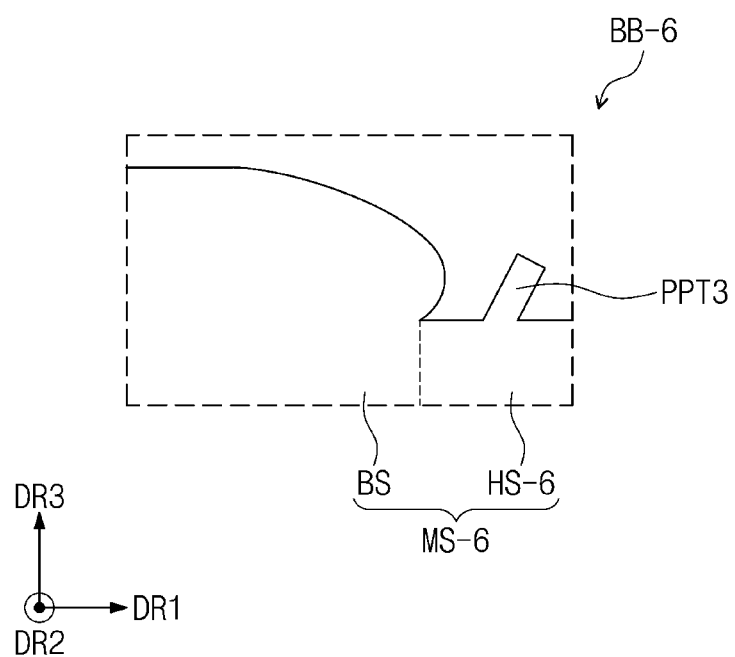

Referring to FIG. 7C, a master substrate MS-6 may include a base substrate BS and an auxiliary portion HS-6.

The auxiliary portion HS-6 may include a third protrusion PPT3 protruding in an oblique direction toward the outside.

The first to third protrusions PPT1 to PPT3 may prevent a portion of the solutions LQ1 and LQ2 from being coated on an undesired portion in the first to third coating processes S200, S300 and S400.

According to the embodiments of the inventive concepts, the window may have the undercut shape, and thus the functional layers might not be easily peeled off.

In addition, the functional layers may be disposed on an entire top surface of the window, and thus corner or edge portions of the functional layers might not be visible to a user.

While the inventive concepts have been described with reference to example embodiments, it will be apparent to those skilled in the art that various changes and modifications may be made without departing from the spirit and scope of the inventive concepts.

What is claimed is:

1. A display module, comprising:
   a display panel including: a display area oriented along a plane defined by a first direction and a second direction intersecting the first direction; and a non-display area at least partially surrounding the display area;
   a window disposed on the display panel and including a transparent material; and
   a set portion receiving the display panel and the window,
   wherein the window comprises:
   a first portion including: a first area at least partially overlapping the display area; and a second area at least partially overlapping the non-display area;
   a second portion extending from the first area of the first portion in a third direction perpendicular to the first direction and the second direction;
   a third portion extending from the second area of the first portion in the third direction, and extending from the second portion in either the first direction or the second direction, the third portion including an outer surface including a first curved surface; and
   a fourth portion extending from the third portion in either the first direction or the second direction, the fourth portion not overlapping the first portion in the third direction, and the fourth portion including an outer surface including a second curved surface, wherein the second curved surface comprises a curved line that extends from a top surface of the third portion and is directly connected to the first portion, and wherein the set portion includes a fixing portion that includes a first curvature making contact with the second curved surface, in the first direction, and a second curvature making contact with a first functional layer that is disposed on the second portion, the third portion and the fourth portion of the window such that the fixing portion has a double-curved shape.

2. The display module of claim 1, wherein each of a first thickness of the first portion and a second thickness of the second portion are constant along their respective lengths, and wherein a third thickness of the third portion and a fourth thickness of the fourth portion gradually decrease along either the first direction or the second direction.

3. The display module of claim 1, wherein the first functional layer of the window includes a first material; and the window further comprises a second functional layer disposed on the first functional layer and including a second material different from the first material.

4. The display module of claim 3, wherein the first material includes an acrylic-based material and/or an epoxy-based material, and the second material includes a fluorine-based material.

5. The display module of claim 4, wherein a thickness of the first functional layer is within a range of about 40 μm to about 50 μm, and a thickness of the second functional layer is within a range of about 4 μm to about 6 μm.

6. The display module of claim 4, wherein the first functional layer comprises:

a first sub-functional layer in contact with each of the second portion, the third portion, and the fourth portion; and a second sub-functional layer disposed between the first sub-functional layer and the second functional layer.

7. The display module of claim 6, wherein a thickness of the first sub-functional layer gradually increases in one direction, and wherein a thickness of the second sub-functional layer gradually decreases in the one direction.

8. The display module of claim 7, wherein a portion, adjacent to a first side, of the first sub-functional layer has a first thickness, and a portion, adjacent to a second side, of the first sub-functional layer has a second thickness, and wherein the second thickness is within a range of 125% to 135% of the first thickness.

9. The display module of claim 6, wherein each of thicknesses of the first and second sub-functional layers is within a range from about 20 μm to about 25 μm in a central portion of the display area.

10. The display module of claim 3, further comprising:

an ink layer disposed between the display panel and the window and at least partially overlapping the non-display area.

11. The display module of claim 10, wherein the ink layer does not overlap the fourth portion of the window in the third direction.

12. The display module of claim 10, further comprising:

a polarizing layer disposed between the display panel and the ink layer.

13. The display module of claim 12, further comprising:

an auxiliary panel disposed under the display panel and including a synthetic resin or a metal.

14. The display module of claim 13, wherein the set portion further receives the auxiliary panel and the polarizing layer, wherein the set portion further comprises a support portion disposed under the auxiliary panel, and wherein the fixing portion extends from a side of the support portion in the third direction.

15. A window, comprising:

a first portion including: a first area oriented along a plane defined by a first direction and a second direction intersecting the first direction; and a second area at least partially surrounding the first area;

a second portion extending from the first area of the first portion in a third direction perpendicular to the first direction and the second direction;

a third portion extending from the second area of the first portion in the third direction, and extending from the second portion in either the first direction or the second direction, and including an outer surface including a first curved surface;

a fourth portion extending from the third portion in either the first direction or the second direction, the fourth portion does not overlap with the first portion in the third direction, and the fourth portion includes an outer surface including a second curved surface; and a first functional layer disposed on the second portion, the third portion, and the fourth portion, wherein the second curved surface comprises a curved line that extends from a top surface of the third portion and is directly connected to a straight outer edge gf the first portion that is perpendicular to the plane defined by the first direction and the second direction, wherein the first functional layer comprises a curved side surface that curves outwardly from the second curved surface, and wherein the second curved surface of the fourth portion and the curved side surface of the first functional layer form a double-curved structure.

16. The window of claim 15, wherein a first thickness of the first portion and a second thickness of the second portion are each constant along their respective lengths, and wherein a third thickness of the third portion and a fourth thickness of the fourth portion gradually decrease in either the first direction or the second direction.

17. The window of claim 15, wherein the first functional layer includes a first material and the window further comprises:

a second functional layer disposed on the first functional layer and including a second material different from the first material.

18. The window of claim 17, wherein the first material includes an acrylic-based material and/or an epoxy-based material, and the second material includes a fluorine-based material.

* * * * *